(12) United States Patent
Ortiz et al.

(10) Patent No.: US 10,816,622 B2
(45) Date of Patent: Oct. 27, 2020

(54) WIRELESS MAGNETIC RESONANCE ENERGY HARVESTING AND COIL DETUNING

(71) Applicant: KONINKLIJKE PHILIPS N.V., Eindhoven (NL)

(72) Inventors: Timothy Ortiz, Alachua, FL (US); Aasrith Ganti, Gainsville, FL (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/334,961

(22) PCT Filed: Sep. 28, 2017

(86) PCT No.: PCT/EP2017/074629
§ 371 (c)(1),
(2) Date: Mar. 20, 2019

(87) PCT Pub. No.: WO2018/060332
PCT Pub. Date: Apr. 5, 2018

(65) Prior Publication Data
US 2019/0265317 A1    Aug. 29, 2019

Related U.S. Application Data

(60) Provisional application No. 62/401,326, filed on Sep. 29, 2016.

(51) Int. Cl.
| | | |
|---|---|---|
| *G01R 33/36* | (2006.01) | |
| *H02J 50/10* | (2016.01) | |
| *G01R 33/341* | (2006.01) | |
| *H02J 7/02* | (2016.01) | |

(52) U.S. Cl.
CPC ....... *G01R 33/3692* (2013.01); *G01R 33/341* (2013.01); *G01R 33/3657* (2013.01); *H02J 7/025* (2013.01); *H02J 50/10* (2016.02)

(58) Field of Classification Search
CPC ............ G01R 33/3692; G01R 33/3657; G01R 33/341; H02J 7/025; H02J 50/10
See application file for complete search history.

(56) References Cited

U.S. PATENT DOCUMENTS

| | | | | |
|---|---|---|---|---|
| 6,856,291 B2 * | 2/2005 | Mickle | .................. | H01Q 1/248 |
| | | | | 343/701 |
| 6,882,128 B1 * | 4/2005 | Rahmel | .................. | H02J 7/025 |
| | | | | 320/101 |

(Continued)

FOREIGN PATENT DOCUMENTS

WO    2008032098 A1    3/2008

OTHER PUBLICATIONS

M.J. Riffe et al "Power Scavangng Circuit for Wireless DC Power" Proc. Intl. Soc. Mag. Reson. Med. 15 (2007) p. 3273.

*Primary Examiner* — G. M. A Hyder

(57) ABSTRACT

A magnetic resonance system includes a wireless power detection sensor and a wireless energy harvesting circuit. The wireless power detection sensor detects magnetic resonance transmissions of the magnetic resonance system. The wireless energy harvesting circuit harvests energy from the magnetic resonance transmissions based on the wireless power detection sensor detecting the magnetic resonance transmissions.

20 Claims, 13 Drawing Sheets

(56) References Cited

U.S. PATENT DOCUMENTS

| | | | |
|---|---|---|---|
| 2007/0109121 A1* | 5/2007 | Cohen | H04Q 9/00 340/539.26 |
| 2012/0256492 A1* | 10/2012 | Song | H02J 7/025 307/66 |
| 2013/0119981 A1 | 5/2013 | Choi et al. | |
| 2013/0200894 A1* | 8/2013 | Albsmeier | A61B 5/055 324/318 |
| 2014/0015470 A1* | 1/2014 | Lim | H02J 5/005 320/101 |
| 2014/0218035 A1 | 8/2014 | Okamoto | |
| 2015/0371771 A1* | 12/2015 | Abu Qahouq | H04B 5/0087 307/104 |
| 2016/0047869 A1* | 2/2016 | Bulumulla | H01H 9/54 324/309 |
| 2016/0124041 A1* | 5/2016 | Pathak | G01R 29/08 324/629 |
| 2017/0077995 A1* | 3/2017 | Leabman | H02J 50/90 |
| 2017/0141818 A1* | 5/2017 | Umeda | H02J 7/025 |
| 2017/0160356 A1* | 6/2017 | Liu | G01R 33/3657 |
| 2017/0176551 A1* | 6/2017 | Deunsing | G01R 33/288 |
| 2017/0214567 A1* | 7/2017 | Salkintzis | H04L 41/0677 |
| 2017/0336484 A1 | 11/2017 | Fuderer et al. | |
| 2018/0165561 A1* | 6/2018 | Gabriel | G06K 7/10356 |

\* cited by examiner

WIRELESS MAGNETIC RESONANCE ENERGY HARVESTING AND COIL DETUNING

CROSS REFERENCE TO RELATED APPLICATIONS

This application is a U.S. national phase application of International Application No. PCT/EP2017/074629, filed on Sep. 28, 2017, which claims the benefit of U.S. provisional Application Ser. No. 62/401,326 filed on Sep. 29, 2016 and is incorporated herein by reference.

BACKGROUND

Magnetic resonance imaging systems are complex systems that use magnets to align and realign hydrogen nuclei (protons) in water molecules in a subject (e.g., human) being imaged. A strong first magnetic field is applied to align the proton "spins", which can then be realigned systematically by applying a second magnetic field. Magnetic resonance imaging systems can include radio frequency (RF) coils to then selectively deliver a B1 field in a transmit stage. In a receive stage, the hydrogen atoms return to an original position (i.e., the position before the selective delivery of the B1 field) and emanate a weak radio frequency signal which can be picked up and used to produce images.

Radio frequency surface coils can be placed close to a patient and body part of interest in order to pick up the weak radio frequency signals in the receive stage. Such radio frequency surface coils may be provided with a detuning circuit for detuning the radio frequency surface coils in a transmit stage while the hydrogen nuclei are being realigned. Currently, galvanic direct current (DC) cables are used to power detune circuits in radio frequency surface coils. Each radio frequency surface coil or coil element may have a detune circuit connected to a direct current cable. The direct current cables for the detune circuits are fed through a system power supply.

In a magnetic resonance imaging system, direct current cables for detune circuits are susceptible to radio frequency surface currents that can burn tissue when placed too close to the subject being imaged. Additionally, high levels of direct current can cause B0 artifacts in the resulting image of the subject.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
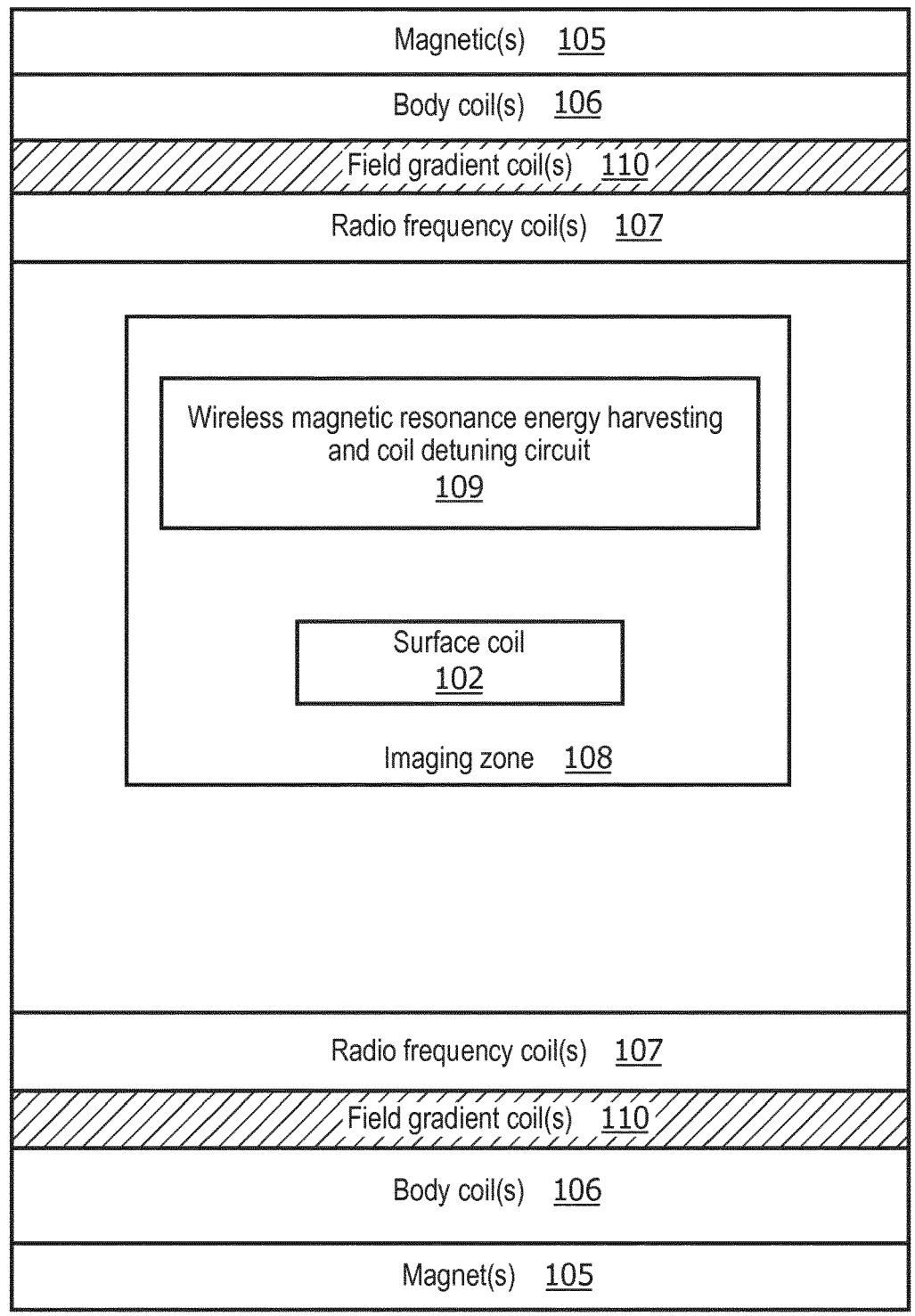
FIG. 1 is a cross-sectional side view of a magnetic resonance imaging system for wireless magnetic resonance energy harvesting and coil detuning, in accordance with a representative embodiment of the present disclosure.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

The terminology used herein is for purposes of describing particular embodiments only, and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

Also, it will be understood that, in addition to their ordinary meanings, the terms "substantial" or "substantially" mean to within acceptable limits or degree to one having ordinary skill in the art. For example, "substantially cancelled" means that one of ordinary skill in the art would consider the cancellation to be acceptable. Likewise, in addition to its ordinary meaning, the term "approximately" means to within an acceptable limit or amount to one having ordinary skill in the art. For example, "approximately the same" means that one of ordinary skill in the art would consider the items being compared to be the same.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

As described herein, energy transmitted during a magnetic resonance (MR) transmit stage is detected, harvested, and repurposed to power one or more circuits used with a magnetic resonance imaging system. The circuits powered with the repurposed energy can include, for example, power detection circuits that detect power levels in the magnetic resonance transmit stage, and detune circuits that detune a coil during the magnetic resonance transmit stage. The coil may be a radio frequency coil, including a radio frequency surface coil placed on or close to a subject being imaged. A radio frequency surface coil is a single element in an array, and multiple such radio frequency surface coils can be placed on or close to a subject to work with a magnetic resonance imaging system.

The detection, harvesting and repurposing can be performed without a control signal from the magnetic resonance imaging system. Additionally, the detection, harvesting and repurposing described herein can be performed wirelessly relative to the energy provided by the magnetic resonance imaging system in the transmit stage. That is, the detection, harvesting and repurposing described herein can be performed without, e.g., galvanic DC power cables being used in order to provide power to a power detection sensor or detuning circuit.

The power detection can be performed during a transmit stage using wireless power detect sensors. The power detection can be synchronized with signals provided to the harvest circuits and detune circuits to turn ON, so that energy is harvested and provided to the detune circuits. The harvested energy is harvested from the radio frequency coils of the magnetic resonance imaging system during the transmit stage. The harvested energy is used to power, for example, the power detection sensor(s) and the detune circuits used with the magnetic resonance imaging system. The power detection sensor(s) detect high levels of energy during the magnetic resonance transmit stage, and low levels of energy during the receive stage of a magnetic resonance sequence, such that the detecting, harvesting and repurposing can be synchronized.

FIG. 1 is a cross-sectional side view of a magnetic resonance imaging system for wireless magnetic resonance energy harvesting and coil detuning, in accordance with a representative embodiment of the present disclosure. The magnetic resonance imaging system 100 in FIG. 1 includes a cylindrical magnet 105 with a bore. The magnet 105 may be housed in a housing that serves as the exterior surface of the magnetic resonance imaging system 100, but is otherwise the outermost functional element described with respect to the embodiment of FIG. 1. Other elements of the magnetic resonance imaging system 100 are provided in the bore of the magnet 105. Additionally, the subject (not shown) being imaged is placed in the bore of the magnet 105. The noted cylindrical magnet is only an example, as other types of magnets can be used for magnetic resonance imaging systems, including a split cylindrical magnet or an open magnet.

The magnetic resonance imaging system 100 in FIG. 1 also includes a cylindrical body coil 106 immediately interior to the magnet 105. The body coil 106 provides the main uniform, static, magnetic field that excites and aligns the hydrogen atoms. Examples of uniform magnetic fields provided by a body coil 105 are 1.5 Teslas, 3.0 Teslas, or 7.0 Teslas. Though the present disclosure mainly describes using hydrogen atoms, the teachings of the present disclosure can also be used and applied with multiple different types of nuclear/spectroscopy imaging technologies and systems. Nuclear/spectroscopy imaging technologies and systems that can use wireless magnetic resonance energy harvesting and coil detuning can use types of atoms including, but not limited to, phosphorous, sodium and carbon.

The magnetic resonance imaging system 100 in FIG. 1 also includes field gradient coils 110. The field gradient coil 110 is immediately interior to the body coil 106. The field gradient coils are relative low frequency coils used to choose a plane of interest relative to the X, Y and Z axes. The field gradient coils 110 are used generate a magnetic field across the subject in the bore of the magnet housing 105 by using a field gradient. This results in different three-dimensional sections or slices within the bore becoming associated with frequencies and a phase encoded coordinate system.

The magnetic resonance imaging system 100 in FIG. 1 also includes a radio frequency coil 107. The radio frequency coil 107 is immediately interior to the field gradient coil 110. The radio frequency coil 107 is used to deliver the B1 field to selected slices of the imaging zone 108. The selected sliced may correspond symmetrically with one or more different three-dimensional sections within the bore. The result of the delivery of the B1 field is to manipulate orientations of magnetic spins of hydrogen nuclei within an imaging zone 108 of the magnetic resonance imaging system 100. The radio frequency coil 107 is used in the transmit stage, and may be used in some systems for the receive stage. That is, once a transmit cycle is complete, the hydrogen atoms return to original positions, and emanate a weak radio frequency signal. This weak radio frequency signal from the hydrogen atoms returned to their original positions is what is picked up in the receive stage of the magnetic resonance imaging cycle.

In FIG. 1, a wireless magnetic resonance energy harvesting and coil detuning circuit 109 is provided in the imaging zone 108. The wireless magnetic resonance energy harvesting and coil detuning circuit 109 may provide multiple differing and varying characteristic functions, including:

1.) detecting magnetic resonance transmissions from the radio frequency coil(s) 107
2.) harvesting energy from the detected magnetic resonance transmissions of the magnetic resonance imaging system in a transmit stage,
3.) comparing detected magnetic resonance transmissions to a threshold,
4.) not harvesting energy from the magnetic resonance imaging system when an operational pulse is not detected, and
5.) detuning a radio frequency surface coil element with harvested energy from the detected magnetic resonance transmissions.

That is, the wireless magnetic resonance energy harvesting and coil detuning circuit 109 may be provided with the radio frequency surface coils 102 that are placed close to a patient and body part of interest in order to pick up the weak radio frequency signals in the receive stage. The wireless magnetic resonance energy harvesting and coil detuning circuit 109 will function as the detuning circuit for detuning such radio frequency surface coils in a transmit stage while the hydrogen nuclei are being realigned. And the wireless magnetic resonance energy harvesting and detuning circuit 109 may be provided with a transceiver for sending data of the weak radio frequency signals from the hydrogen atoms of the subject to a processor for analysis and display. However, the wireless magnetic resonance energy harvesting and coil detuning circuit 109 also is provided with an ability to detect and selectively harvest energy from the magnetic resonance imaging system 100 to self-power the wireless magnetic resonance energy harvesting and coil detuning circuit 109 with repurposed energy.

That is, as explained above, atoms such as the hydrogen nuclei (spins) are first aligned by a main magnetic field from the body coil 106, and then the imaging plane of interest is set from the field gradient coils 110. The radio frequency coil 107 provides the B1 field to specified slices within the imaging zone 108. The radio frequency surface coil 102 picks up the resulting relatively weak radio frequency resonance signals as the re-aligned nucleis (spins) return to their prior positions. The wireless magnetic resonance energy harvesting and coil detuning circuit 109 can tune to a particular frequency of interest to pick up the resonance signals from the B1 field. These resonance signals from the combined B0 and B1 fields are passed to a processor for processing so that an image representation can be reconstructed for display on a screen (monitor).

The energy from radio frequency coil 107 and/or the field gradient coil 110 and/or the body coil 105 can be harvested by the wireless magnetic resonance energy harvesting and coil detuning circuit 109. The energy from the radio frequency coil 107, the field gradient coil 110, and the body coil 105 is orders of magnitude larger than the resonance signals from the human body. Radio frequency surface coils 102 work on the principle of Biot-Savart's law. The radio frequency surface coils 102 used for receiving these resonance signals can support large currents. So, for multiple reasons, including patient safety and to protect sensitive receiver equipment, the wireless magnetic resonance energy harvesting and coil detuning circuit 109 detunes during the transmit phase when the strong energy from the radio frequency coil 107, the field gradient coil 110, and/or the body coil 105 is emitted.

Figure 2:
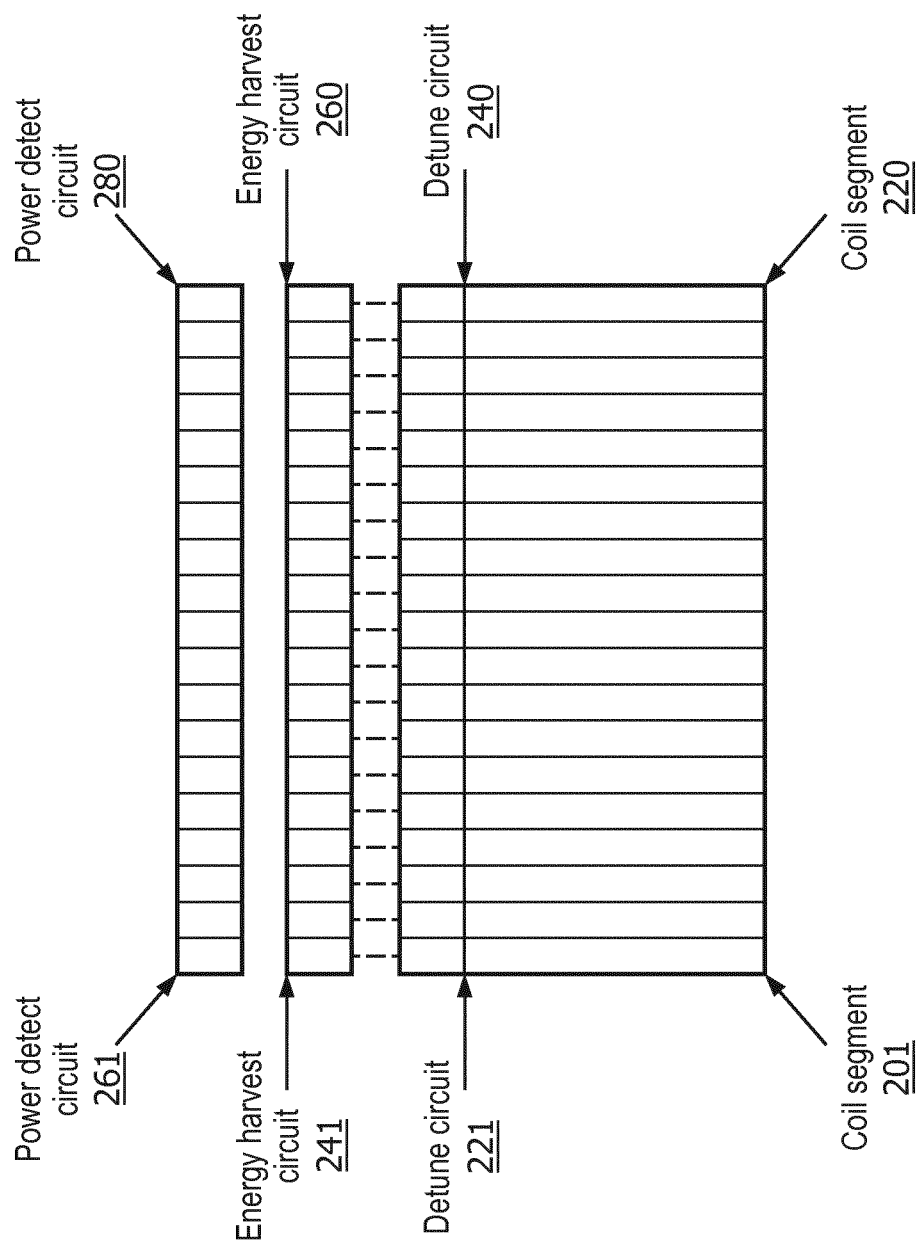
FIG. 2 is a view of an arrangement of elements for wireless magnetic resonance energy harvesting and coil detuning, in accordance with a representative embodiment of the present disclosure.

FIG. 2 is an arrangement of elements for wireless magnetic resonance energy harvesting and coil detuning, in accordance with a representative embodiment of the present disclosure. In FIG. 2, coil segments 201-220 are used to receive the varying radio frequency energy conveyed from the nucleis (spins) re-aligned by the radio frequency coils 107 in FIG. 1. The coil segments 201-220 may be, for example, radio frequency surface coils placed on or near a subject being imaged. Although twenty coil segments 201-220 are shown in FIG. 2, a magnetic resonance imaging system 100 may include fewer or more such coil segments 201-220 without departing from the scope of the present teachings. As an example, some modern magnetic resonance imaging systems have as many as forty-eight (48) different coil segments in one or more of the types of coils described herein.

Each coil segment 201-220 is connected to a corresponding detune circuit 221-240. As explained already, the detune circuits 221-240 are used to specifically decouple coil segments 201-220 from the energy transmitted by radio frequency coil(s) 107 during a transmit stage of the magnetic resonance imaging system 100. That is, the detune circuits 221-240 are used to ensure that the coil segments 201-220 do not substantially transfer the transmit stage energy from the radio frequency coil(s) 107 to the coil segments 201-220. The detune circuits 221-240 are physically connected to the coil segments 201-220. The detune circuits 221-240 may even be considered components of coil segments 201-220, such as when a specific detune circuit 221-240 is specifically dedicated to and physically connected to or otherwise physically integrated with a specific coil segment 201-220.

In FIG. 2, energy harvest circuits 241-260 are used to harvest wireless energy as explained herein. The energy harvest circuits 241-260 can store harvested energy in an energy storage such as a battery (not shown), or may provide the harvested energy directly for use by, for example, the detune circuits 221-240. Also in FIG. 2, power detect circuits 261-280 are provided. The power detect circuits 261-280 detect when power from the radio frequency coil(s) 107 is being transmitted in a Transmit stage. The detection of power from the radio frequency coil(s) 107 is used as the basis to signal, trigger and activate the energy harvest circuits 241-260 to start harvesting energy, and to have the detune circuits 221-240 detune the corresponding coils segments 201-220 of the radio frequency coil.

Of course, the radio frequency coil(s) 107 in FIG. 1 may be used for both transmissions in the transmit stage and reception in the receive stage. In such a case, the detune circuits 221-240 can detune the radio frequency coil(s) 107 in the same manner described herein, though in such an embodiment there is less of a danger presented by such radio frequency coil(s) 107. However, when the cylindrical radio frequency coil(s) 107 are used for both transmissions in the transmit stage and reception in the receive stage, much of the data from hydrogen nuclei in the subject is lost compared to the data that could be otherwise captured by surface coil segments 201-220. Thus, using the same radio frequency coil(s) 107 for both the transmit stage and the receive stage is not normally preferred.

In FIG. 2, connections between the energy harvest circuit 241-260 and detune circuits 221-240 may be physical connections used to transfer power to the detune circuits 221-240. Additionally, although not shown, power detect circuits 261-280 may be connected via signal lines to signal the energy harvest circuits 241-260 when to harvest energy (and/or to specifically not harvest energy), and to signal the detune circuits 221-240 when to detune the coil segments 201-220.

FIG. 2 shows a 1 to 1 correspondence for the power detect circuits 261-280, energy harvest circuits 241-260, detune circuits 221-240, and coil segments 201-220. However, for example, when larger sized loops are present, multiple detune circuits 221-240 and energy harvest circuits 241-260 can be used with a single detect circuit 261-280 or multiple detect circuits 261-280. That is, a 1 to 1 correspondence is not strictly necessary for the power detect circuits 261-280, energy harvest circuits 241-260, detune circuits 221-240, and coil segments 201-220 in every configuration.

Figure 3:
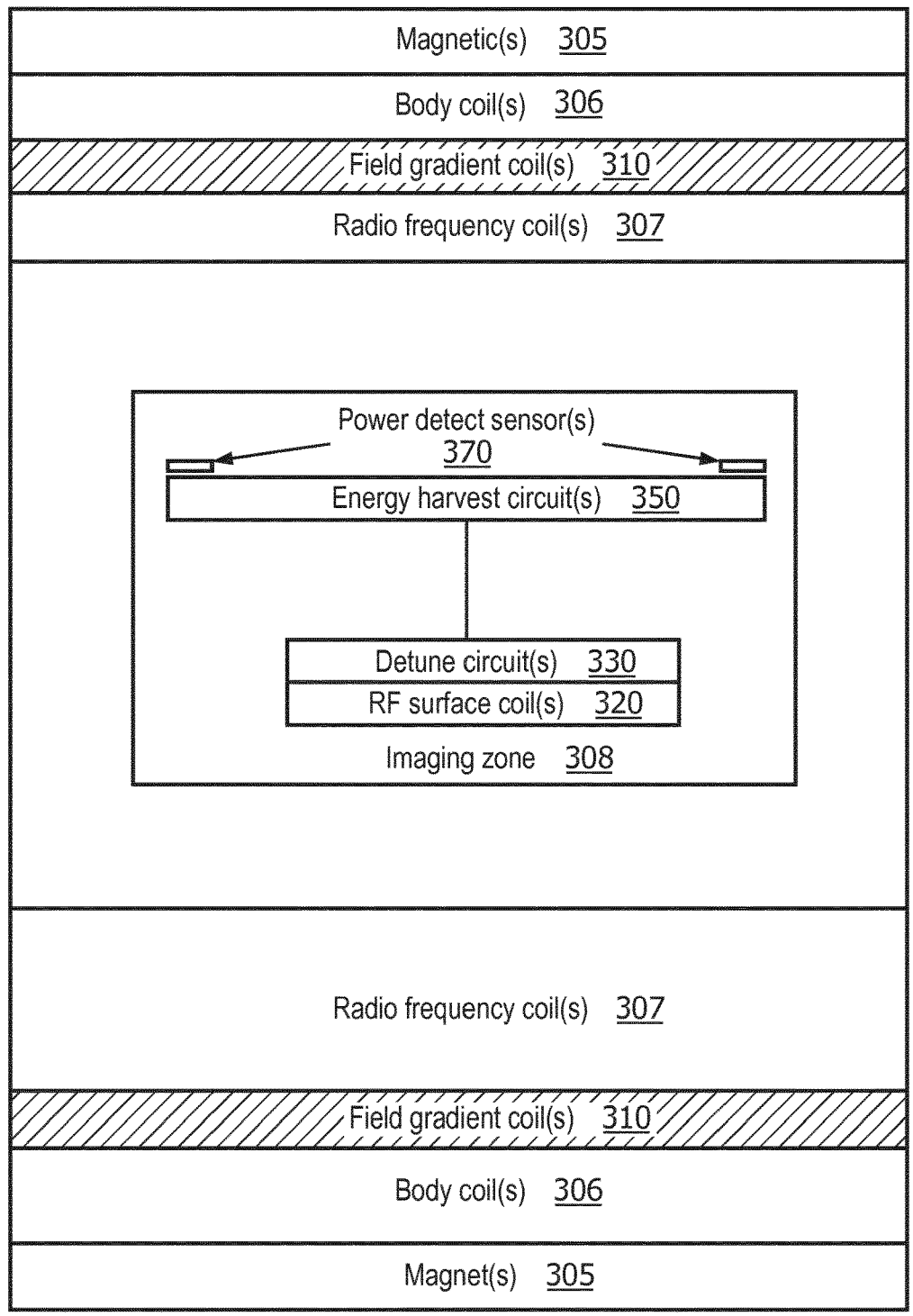
FIG. 3 is a cross-sectional side view of a magnetic resonance imaging system for wireless magnetic resonance energy harvesting and coil detuning, in accordance with a representative embodiment of the present disclosure.

FIG. 3 is a cross-sectional side view of another magnetic resonance imaging system for wireless magnetic resonance energy harvesting and coil detuning, in accordance with a representative embodiment of the present disclosure. In FIG. 3, a magnetic resonance imaging system 300 includes outer magnet(s) 305, body coil(s) 306, field gradient coil(s) 310, and radio frequency coil(s) 307, each of which is the same as or similar to the corresponding elements in the embodiment of FIG. 1. However, multiple different circuits are provided in the imaging zone 308 in place of the wireless magnetic resonance energy harvesting and coil detuning circuit 109 in the embodiment of FIG. 1. The circuits in the imaging zone 308 include radio frequency (RF) surface coil(s) 320, detune circuit(s) 330, energy harvest circuit(s) 350 and power detect sensor(s) 370.

The radio frequency surface coil(s) 320 are provided to pick up radio frequency signals emanating from the hydrogen atoms in the subject being imaged. For this reason, the radio frequency surface coil 320 is shown as the lowest element in the imaging zone 308, with the understanding that the radio frequency surface coil(s) 320 will be placed on or near the subject being imaged. The detune circuit(s) 330 are attached to the radio frequency surface coil(s), and are used to detune the radio frequency surface coil(s) 320 during a transmit stage. The detune circuit(s) 330 have the function of decoupling the radio frequency surface coil 320 from the emitted transmitted pulse from the radio frequency coil(s) 307. An explanation of basic detuning for a magnetic resonance imaging system is provided by Vartiovaara, U.S. Pat. No. 8,013,609 (Sep. 6, 2011), which is hereby incorporated by reference in its entirety.

The power detect sensor(s) 370 can be placed anywhere in the imaging zone 308. The power detect sensor(s) 370 can also be placed outside of the imaging zone 308, so long as they are in a position to detect pulses emanating from the radio frequency coil(s) 307 in a transmit stage. In FIG. 3, power detect sensors 370 and energy harvest circuit(s) 350 are provided to detect and harvest energy from the radio frequency coil(s) 307, and power and coordinate with the detune circuit(s) 330 to decouple the radio frequency surface coil(s) 320 during the transmit stage.

The energy harvest circuit(s) 350 in FIG. 3 is separated from the detune circuit(s) 330, but with an electrical connection to provide harvested energy to the detune circuit(s) 330. The power detect sensor(s) 370 detect pulses from the radio frequency coil(s) 307. The pulse is an operational pulse correlated with a (first) preset threshold used to determine whether the pulse indicates that the radio frequency surface coil(s) 320 are in a transmit stage. The power detect sensor(s) 370 compares received power to a threshold, and identifies when the operational pulse is being transmitted from the radio frequency coil(s) 307 such that the power is above the threshold. The power detect sensor(s) 370 may also identify when power is below a threshold and indicates either that no pulse was generated, or that transmission of a pulse had ended. The threshold to confirm a pulse may be the same threshold as the threshold to confirm no pulse, though the thresholds for these two different purposes may also differ. The power detect sensor(s) 370 may be connected by a signal transfer line to energy harvest circuit(s) 350 to coordinate harvesting energy, and to detune circuit(s) 330 to coordinate detuning of the radio frequency surface coil(s) 320.

The energy harvest circuit(s) 350 can include a match circuit for impedance matching in a narrow frequency range in order to transfer some portion of the energy output from, for example, the radio frequency coil(s) 307 to the energy harvest circuit(s) 150. Many types of circuits can be used for impedance matching, including transformers and L-networks. As an example of elements that can be used, an inductor can be used to capture energy and a capacitor can be used to store energy in energy harvest circuit(s) 350. A specific circuit example of wireless energy harvesting is explained below with respect to FIG. 9.

Figure 4:
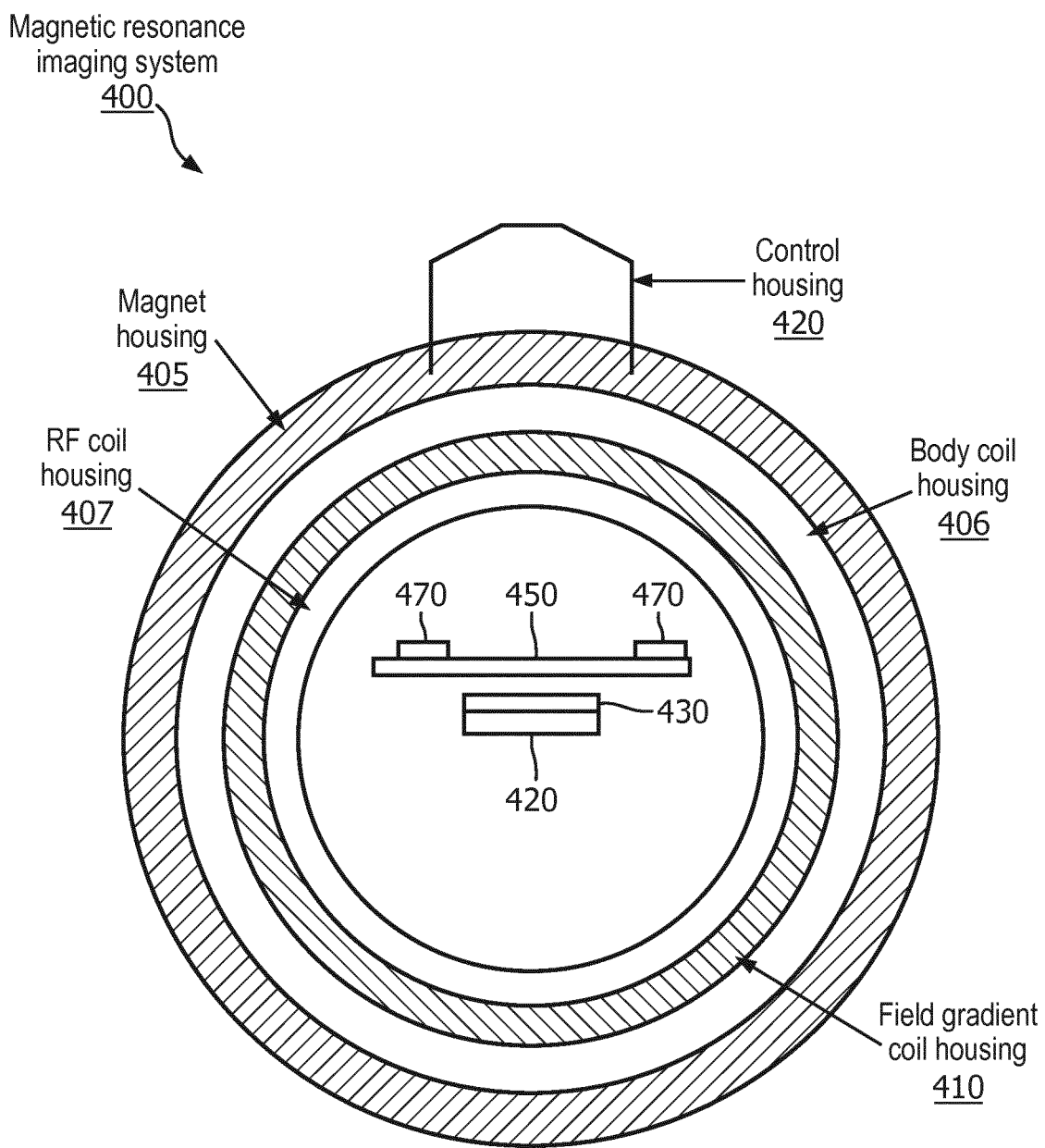
FIG. 4 is a cross-sectional front view of a magnetic resonance imaging system for wireless magnetic resonance energy harvesting and coil detuning, in accordance with a representative embodiment of the present disclosure.
Figure 4:
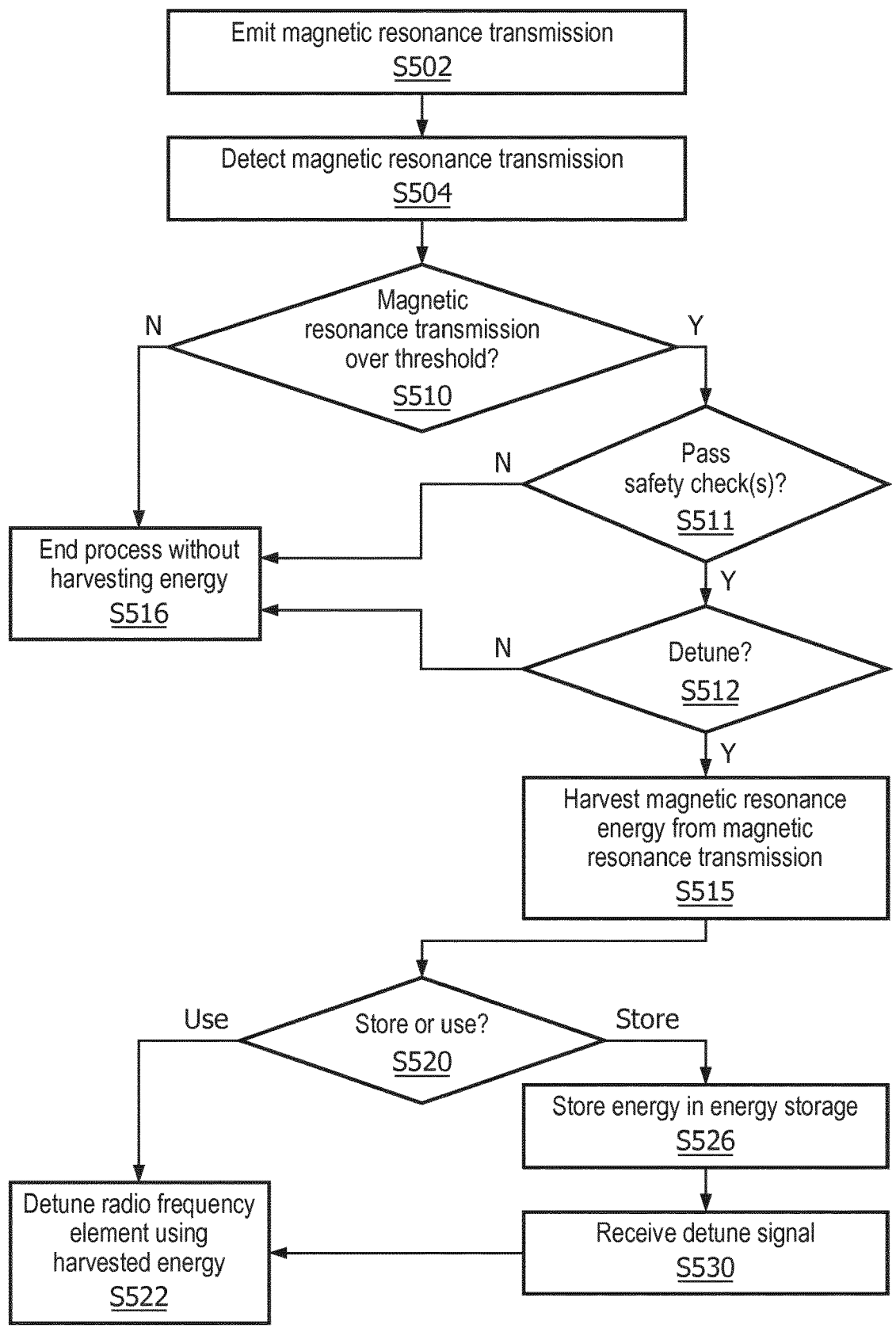

In FIG. 4, a magnet housing 405 is designated with a hatch pattern as an outer structure of a magnetic resonance imaging system 400. A body coil housing 406 is immediately interior to the magnet housing 405. A field gradient coil housing 410 is immediately interior to the body coil housing 406. A radio frequency (RF) coil housing 407 is immediately interior to the field gradient coil housing 410. A control housing 420 is provided on the magnet housing 405 to house, e.g., external circuitry such as a transceiver.

In FIG. 4, two power detect sensors 470 are provided within the radio frequency surface coil to detect when the radio frequency coils within the radio frequency coil housing 407 are transmitting pulses. The number of power detect sensors 470 is not limited to two, and may instead be one, the same number as the radio frequency coils within the radio frequency coil housing 407, or another number without departing from the scope of the present teachings. An energy harvest circuit 450 is provided to harvest energy from the radio frequency coil(s) in the radio frequency coil housing 407 and/or field gradient coil(s) in the field gradient coil housing 410 and/or the body coil(s) in the body coil housing 406.

Additionally, detune circuit(s) 430 are provided with the radio frequency surface coil(s) 420. Energy harvested by the energy harvest circuit(s) 450 is provided to the detune circuit(s) 430. As described herein, the energy can be provided to the detune circuit(s) 430 in real-time or near real-time when the energy is harvested, or can be provided from an energy storage such as a battery. The detune circuit(s) 430 detune the radio frequency coil(s) 420 during the transmit stage based on the detection by the power detect sensors 470 and using the energy harvested by the energy harvest circuit(s) 450.

Figure 5:
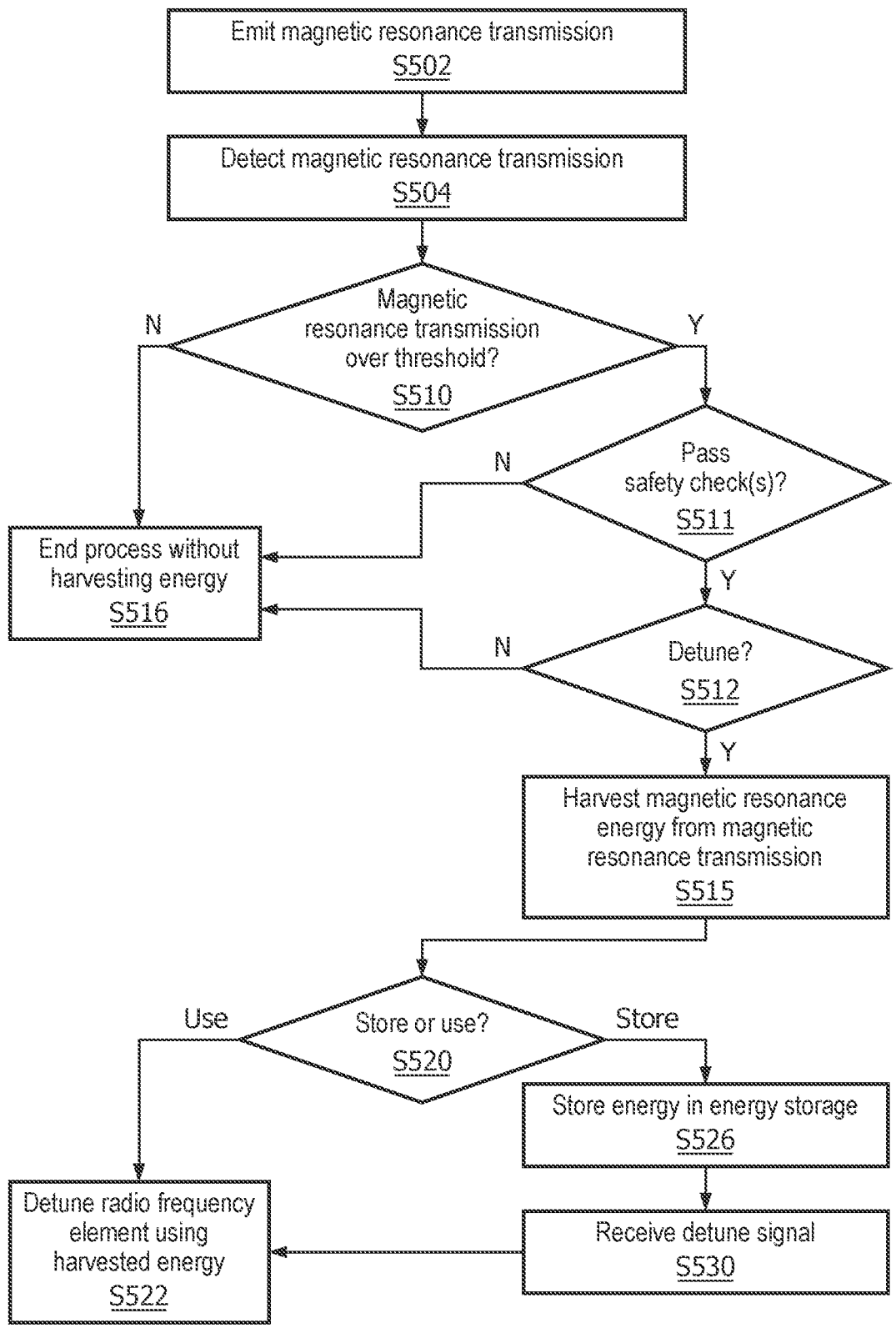
FIG. 5 is a flow diagram showing an operational method for wireless magnetic resonance energy harvesting and coil detuning, in accordance with a representative embodiment of the present disclosure.

FIG. 5 is a flow diagram showing an operational method for wireless magnetic resonance energy harvesting and coil detuning, in accordance with a representative embodiment of the present disclosure. In FIG. 5, a magnetic resonance transmission is emitted at block S502. The magnetic resonance transmission emitted at block S502 is typically the radio frequency magnetic resonance transmission from the radio frequency coil(s) 107 as in FIG. 1. However, as explained throughout this document, the radio frequency magnetic resonance transmission from radio frequency coil(s) 107 is emitted after magnetic resonance transmissions from the body coil(s) 106 and field gradient coil(s) 110 have started in order to align and selectively re-align the hydrogen nuclei in the subject being imaged. At block S502, the emitted magnetic resonance transmission is the transmission from the radio frequency coil(s) 107.

At block S504, the emitted magnetic resonance transmission is detected by, for example, a power detect sensor 370 in FIG. 3. At block S510, the emitted magnetic resonance transmission is compared with a threshold. If the detected magnetic resonance transmission is not within the threshold limits (block S510=No), the process ends at block S516 without harvesting power. If the detected magnetic resonance transmission is within the threshold limits (block S510=Yes), a safety check is imposed at block S511.

A safety check at block S511 may be, for example, a check for a short or open connection in detune circuit(s) 330. The safety check at block S511 may also be a check if the detected magnetic resonance transmission power variation is too large, such that the second threshold is higher than the (first) threshold used at block S510. Safety checks may also be performed for the magnetic resonance imaging systems 100, 300 generally, such as to confirm that all radio frequency surface devices are able to sustain radio frequency power transmissions, to confirm that radio frequency power is focused in the subject being imaged, and/or that no radio frequency devices are otherwise malfunctioning.

The detected magnetic resonance transmission power level that is not within the threshold limits may be deemed unsafe, for example. If the safety check(s) at block S511 are not passed (block S511=No), the process ends at block S516 without harvesting energy. A result of safety check(s) at block S511 may be to shut off the entire magnetic resonance imaging system 100, of the energy provided to one or more of the body coil(s) 306, the radio frequency coil(s) 307, and the field gradient coil(s) 310.

If the safety check(s) at block S511 are passed (block S511=Yes), a determination is made at S512 whether to detune the radio frequency surface coil(s) 320. The determination at block S512 may be an affirmative determination whether or not to detune the radio frequency surface coil(s) 320 based on, for example, whether energy is already stored in a storage device from previous magnetic resonance transmissions. A storage device check at block S512 may be a check whether a storage device is full or nearly full. A full storage device may reflect that power is already available for the detune circuit(s) 330, and collecting additional energy from a new magnetic resonance transmission is unnecessary. If a decision is made not to detune at block S512 (block S512=No), the process ends without harvesting energy at block S516.

If the decision is made to detune radio frequency surface coil(s) 320 at block S512 (block S512=Yes), magnetic resonance energy is harvested from the current magnetic resonance transmission at block S515. At block S520, a determination is made whether to store or (immediately) use the harvested energy. If the decision is to use the harvested energy immediately at block S520, at block S522 the radio frequency surface coil(s) 320 are detuned using the harvested energy without storing the harvested energy in a battery or other intermediate or long term energy storage. If the decision is to store the harvested energy at block S520, at block S526 the energy is stored in an energy storage until a detune signal is later received at block S530. When the detune signal is received at block S530, energy from the battery is used to detune the radio frequency surface coil(s) 320 at block S522.

Figure 6:
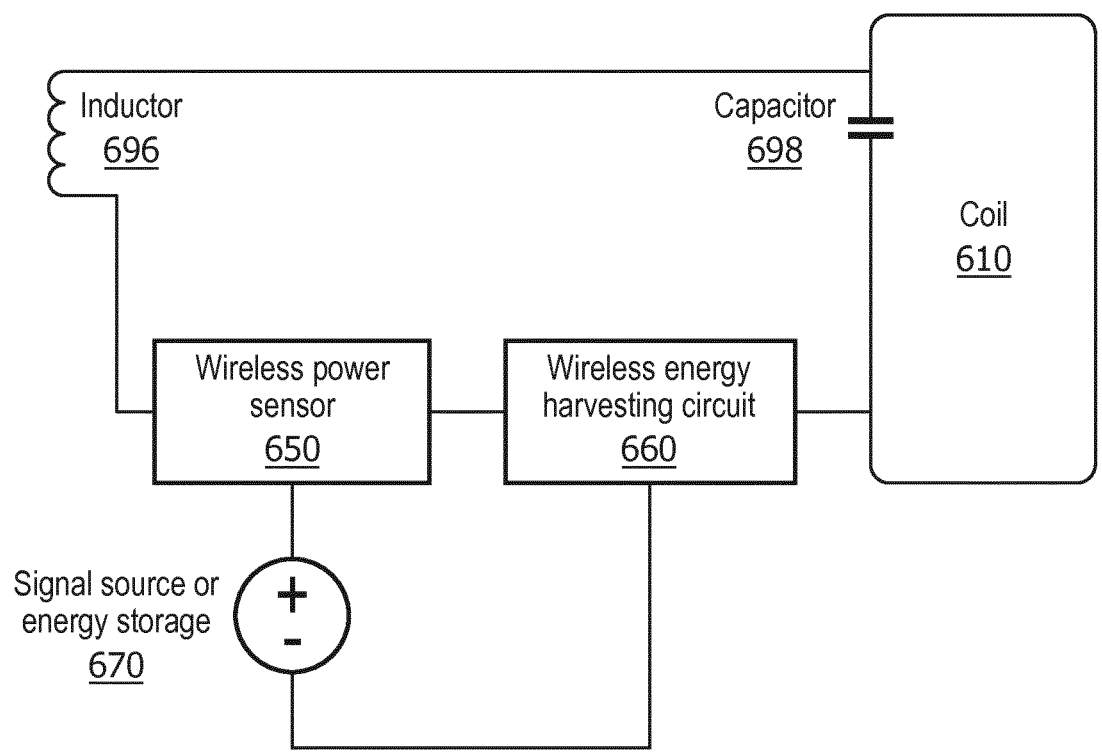
FIG. 6 is a circuit diagram for wireless magnetic resonance energy harvesting and coil detuning, in accordance with a representative embodiment of the present disclosure.

FIG. 6 is a circuit diagram for wireless magnetic resonance energy harvesting and coil detuning, in accordance with a representative embodiment of the present disclosure. In FIG. 6, a magnetic resonance imaging system includes a radio frequency surface coil 610 that receives radio frequency signals from, for example, the hydrogen nuclei of water molecules during a receive stage. The radio frequency surface coil 610 includes elements of a detune circuit with inductor 696 and capacitor 698. A wireless power sensor 650 detects energy from the radio frequency coil(s) 107 or 307 (not shown) when the radio frequency coil(s) 107 or 307 are transmitting pulses, and synchronizes with the wireless energy harvesting circuit 660 to harvest the energy from the radio frequency coil(s) 107 or 307.

In FIG. 6, collected energy can be used to directly power the circuits associated with the magnetic resonance imaging system 100, or may be stored in an energy storage 670 such as a battery. A signal source (direct) or energy storage 670 is shown in FIG. 6 to represent the options to store or directly power circuits using harvested energy. A capacitor 698 and inductor 696 are used as the detune circuit for the radio frequency coil 610.

In FIG. 6, the wireless power sensor 650 and wireless energy harvesting circuit 660 are placed close to the detune circuit on every channel element of the radio frequency surface coil 610. The wireless power sensor 650 and wireless energy harvesting circuit 660 can be connected to the energy storage 670 to toggle between harvesting energy and turning off. The energy storage 670 may be, for example, a battery, and may represent a back-up. While the magnetic resonance imaging system is in transmit mode, the energy will be detected, harvested, and repurposed to charge the energy storage 670 or power the detune circuit to be ON. In the receive mode, the detune circuit, the wireless power sensor 650 and the wireless energy harvesting circuit 660 are all turned OFF.

Figure 7:
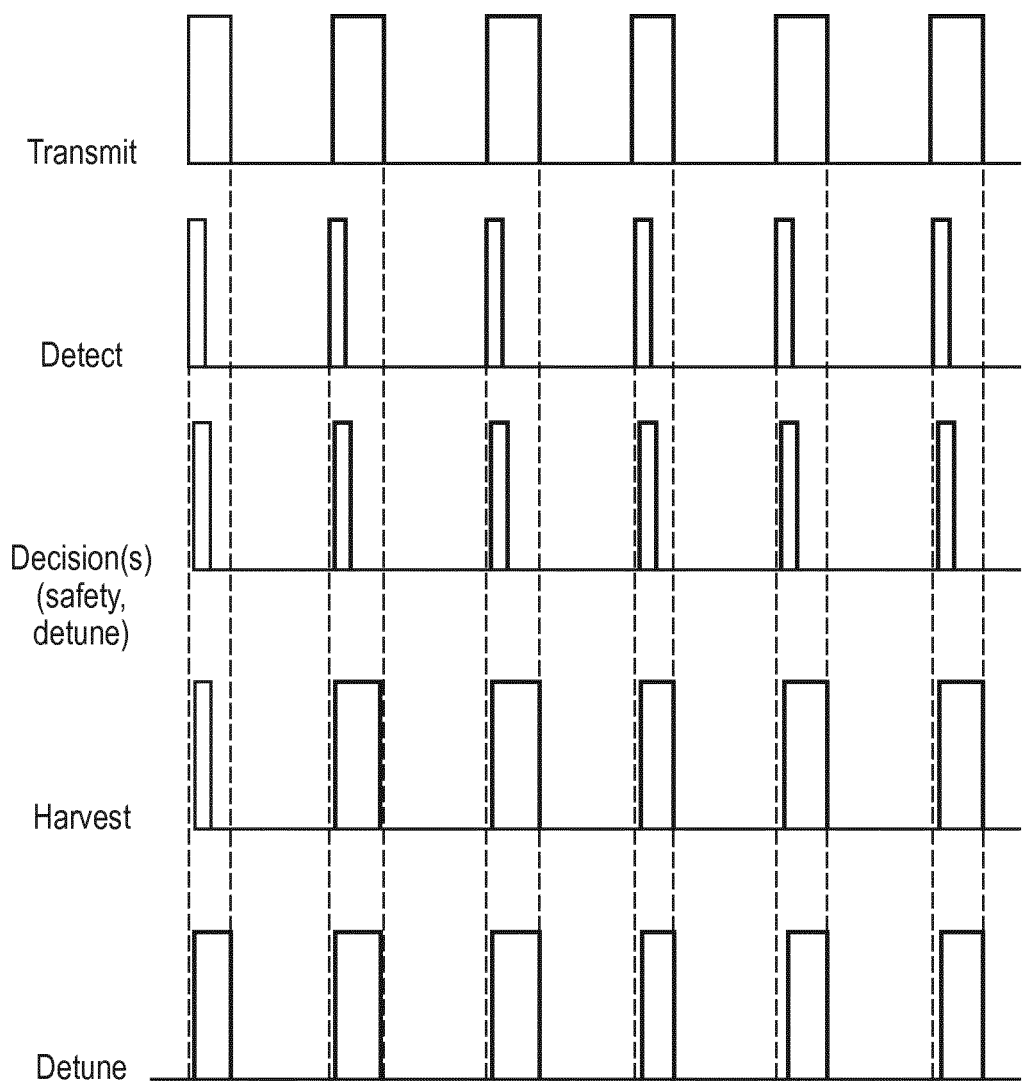
FIG. 7 is a timing chart for wireless magnetic resonance energy harvesting and coil detuning, in accordance with a representative embodiment of the present disclosure.

FIG. 7 is a timing chart for wireless magnetic resonance energy harvesting and coil detuning, in accordance with a representative embodiment of the present disclosure. In FIG. 7, six timing sequences are shown for transmit, detect, decision(s), harvest, and detune operations. The most important information to be derived from FIG. 7 is the relative timing between each operation in any sequence. However, wireless magnetic resonance energy harvesting and coil detuning is not limited the timing or sequence in FIG. 7.

During the transmit operation, an operational pulse from a radio frequency coil(s) 107 is emitted in a transmit stage. All four of the other operations shown in FIG. 7 occur entirely or substantially entirely during the time the operational pulse is emitted. The operational pulse is detected in the detect operation at, or very close to, the very start of the transmit operation. Decisions such as a safety check (block S511) and/or a detune decision (block S512) are made in a decision operation starting immediately after the detect operation. The detect operation and the decision operation occur entirely during the transmit operation.

The harvest operation starts after the decision operations are completed, such as once the harvest operation is authorized. The harvest operation coincides entirely or almost entirely with the detune operation, where energy is harvested and used to detune radio frequency surface coil(s) 320. Timing of the detune operation may deviate from timing of the harvest operation when, for example, the harvested energy is to be stored in an energy storage such as a battery, while energy from the battery is used for the detune operation.

Figure 8:
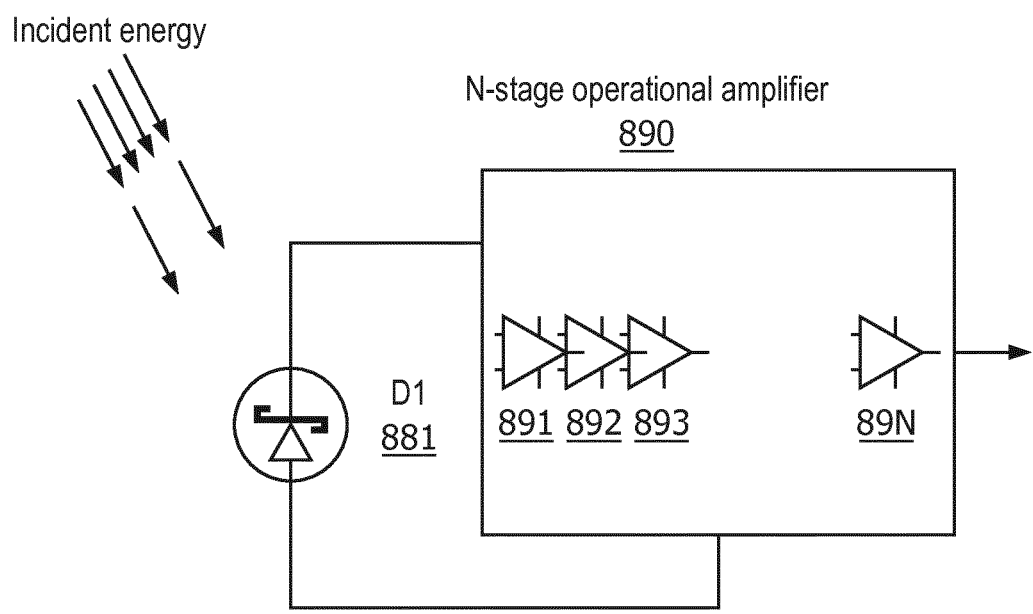
FIG. 8 is another circuit diagram for wireless magnetic resonance energy harvesting and coil detuning, in accordance with a representative embodiment of the present disclosure.

FIG. 8 is another circuit diagram for wireless magnetic resonance energy harvesting and coil detuning, in accordance with a representative embodiment of the present disclosure. The circuit diagram in FIG. 8 is for a power detect circuit such as power detect circuits 261-280, power detect sensors 370 or 470, and/or wireless power sensor 650. A detector D1 881 can be a Schottky diode with a very low V1, for example, or a similar detector element. Output of the detector D1 881 is amplified by an N-stage operational amplifier 890 to produce a detection signal when an operational pulse from radio frequency coil(s) 107 or 307 is detected. The N-stage operational amplifier 890 includes a series of operational amplifiers 891, 892, 893 through 89N to amplify the output of the detector D1 881 to produce the detection signal output from the N-stage operational amplifier 890.

Figure 9:
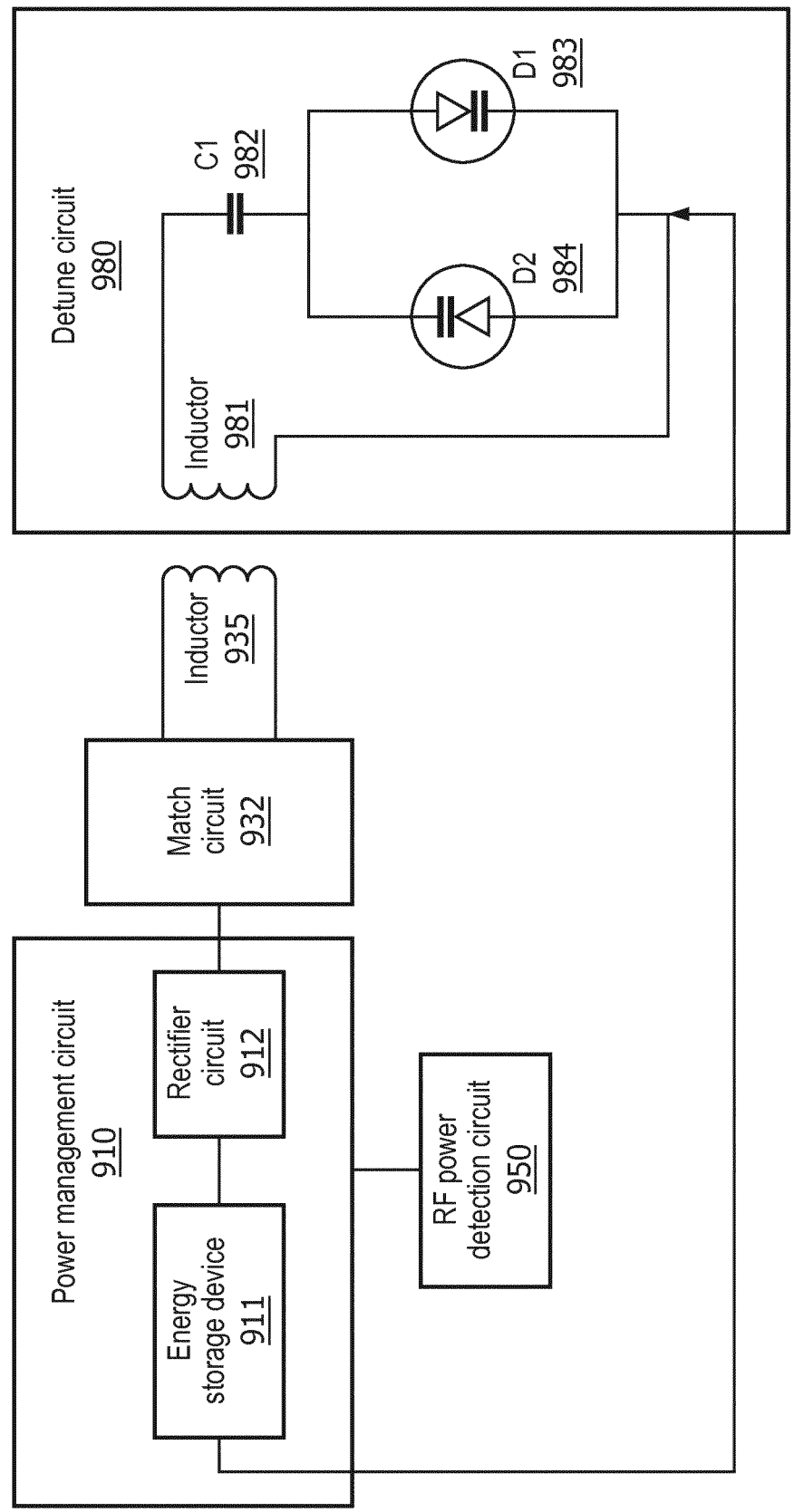
FIG. 9 is another circuit diagram for wireless magnetic resonance energy harvesting and coil detuning, in accordance with a representative embodiment of the present disclosure.

FIG. 9 is another circuit diagram for wireless magnetic resonance energy harvesting and coil detuning, in accordance with a representative embodiment of the present disclosure. The circuit arrangement in FIG. 9 includes a detune circuit 980 that includes an inductor 981, a capacitor 982, and two diodes D1 983 and D2 984. The two diodes D1 983 and 984 are anti-parallel diodes used as a switch for the capacitor 982. Energy collected by inductor L2 is used to detune a radio frequency surface coil that includes the detune circuit 980 but which is otherwise not shown in FIG. 9. The detune circuit 980 wirelessly receives harvested energy from a match circuit 932 via an inductor 935 and the inductor 982. While a 2-inductor design is shown in FIG. 9, other types of coupling devices that are based on inductive coupling can also be used.

In FIG. 9, a logical signal is received by the detune circuit 980 to switch the anti-parallel diodes D1 983 and D2 984. While diodes D1 983 and D3 984 are shown in FIG. 9, the use of diodes is only representative, and other electrical components and/or circuits can be used in place of parallel diodes D1 983 and D2 984. The logical signal is received from the radio frequency power detection circuit 950 via the power management circuit 910, and is received based on the power detection circuit 950 detecting an operational pulse from the radio frequency coil(s) 107 or 307. The energy harvest circuit in FIG. 9 includes a match circuit 932 for impedance matching in a frequency range in order to transfer some portion of the energy output from the energy storage device 911 via the rectifier circuit 912 and inductors 935, 981.

Figure 10:
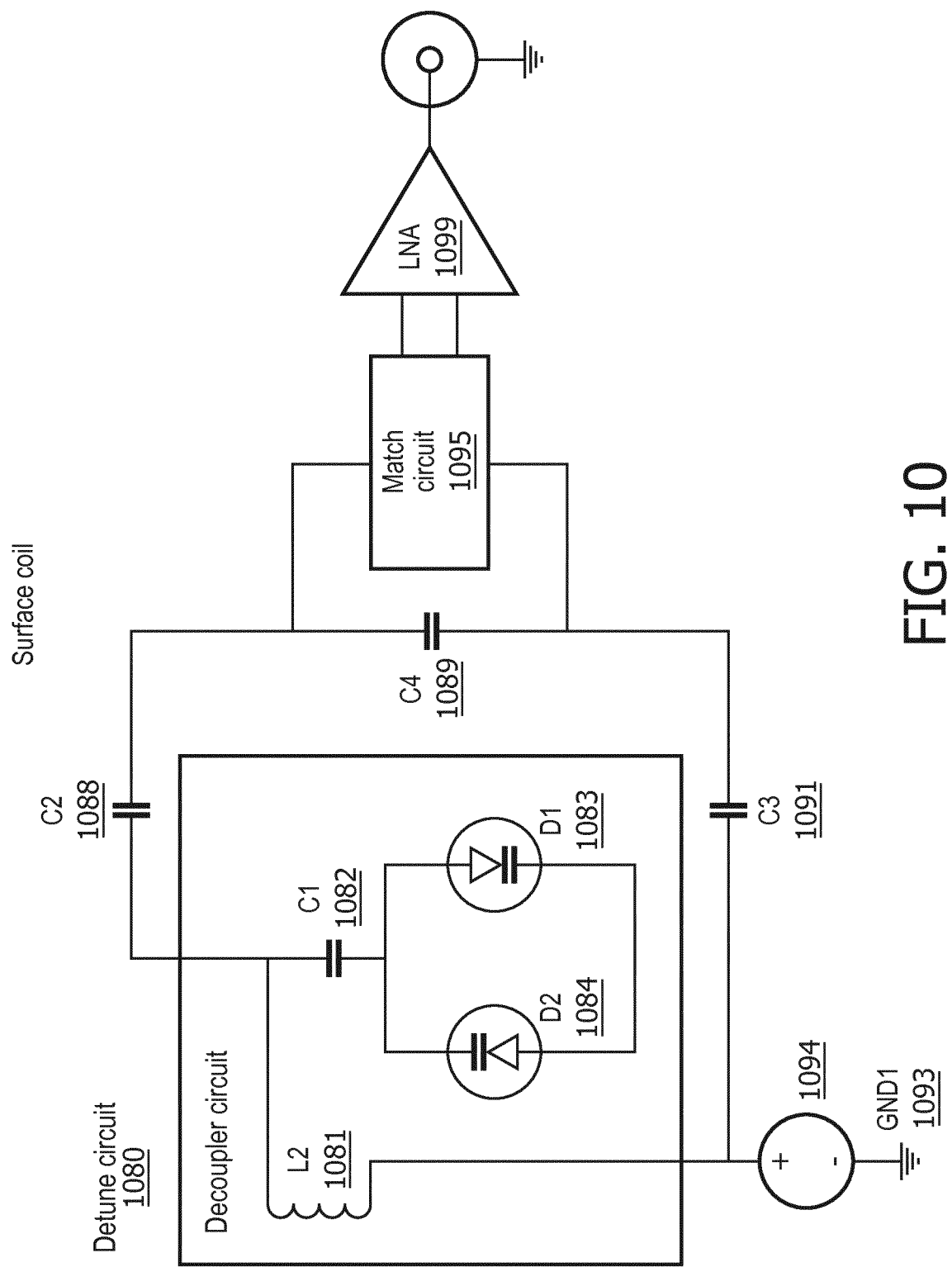
FIG. 10 is another circuit diagram for wireless magnetic resonance energy harvesting and coil detuning, in accordance with a representative embodiment of the present disclosure.

FIG. 10 is another circuit diagram for wireless magnetic resonance energy harvesting and coil detuning, in accordance with a representative embodiment of the present disclosure. In FIG. 10, the detune circuit 980 is shown in the context of a surface coil, but without the power management circuit 910 and radio frequency power detection circuit 950 from FIG. 9.

As shown in FIG. 10, a surface coil includes capacitors C1 1082, C2 1088, C3 1089 and C3 1091. The detune circuit 1080 is a decoupler circuit that includes an inductor L2 1081, the capacitor C1 1082, and the two anti-parallel diodes D1 1083 and D2 1084. The detune circuit 1080 in FIG. 10 is similar to or the same as the detune circuit 980 in FIG. 9, and repetitive descriptions therefore are omitted.

In FIG. 10, the anti-parallel diodes D1 1083 and D2 1084 again act as a switch to turn the detune circuit 1080 on and off based on a received instruction signal from, for example, a wireless power detector. The surface coil in FIG. 10 outputs data to a match circuit 1095 and ultimately to a low noise amplifier (LNA) 1099. The low noise amplifier 1099 provides output via a coaxial wire. The output from the low noise amplifier 1099 is amplified output of received radio frequency signals received by the surface coil in FIG. 10. The received radio frequency signals are from the hydrogen nuclei of the water molecules in the subject being imaged, and are received during the received stage of a cycle.

As explained herein, the detune circuit 1080 is integrated with the surface coil in FIG. 10, and shares the capacitor C1 1082. The detune circuit 1080 is selectively turned ON by an external signal from, for example, a wireless power detector. The detune circuit 1080 receives power from a battery or directly from a wireless energy harvest circuit via the inductor L2 1081.

Figure 11:
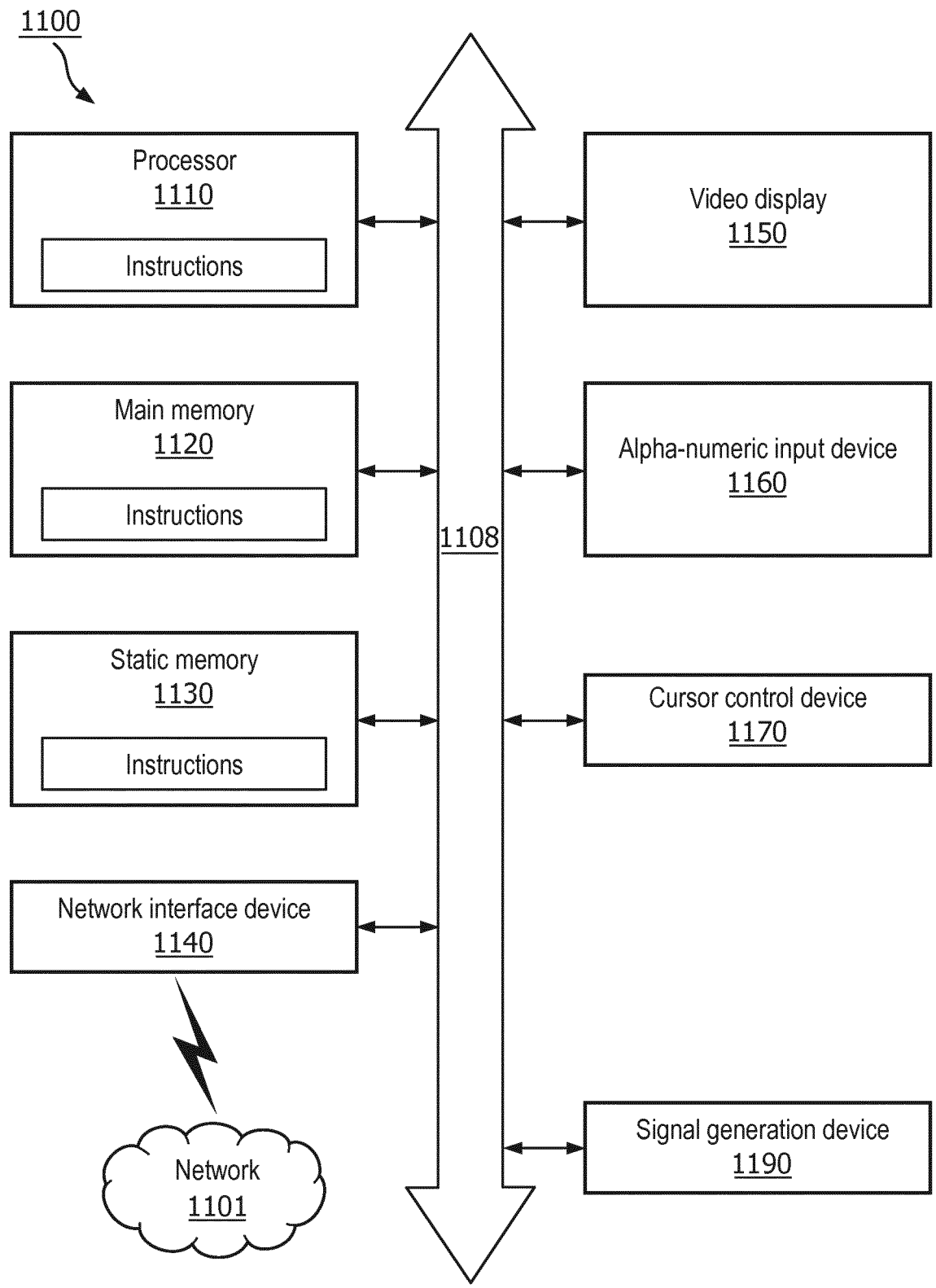
FIG. 11 is a block diagram showing an exemplary general computer system that includes a set of instructions for wireless magnetic resonance energy harvesting and coil detuning, in accordance with a representative embodiment of the present disclosure.

FIG. 11 shows an exemplary general computer system that includes a set of instructions for wireless magnetic resonance energy harvesting and coil detuning, in accordance with a representative embodiment of the present disclosure. In the embodiment of FIG. 11, the exemplary general computer system 1100 is representative of a device that performs logical operations using a processor for the wireless magnetic resonance energy harvesting and coil detuning described herein. The general computer system 1100 may be used, for example, to receive the amplified data from the coaxial output in FIG. 10, and may execute a program to generate an image or video representation. Alternatively, the general computer system 1100 may be used to control the transmit sequence for magnetic resonance imaging systems 100 or 300, including safety features which may be logically redundant to physical safety features provided by wireless magnetic resonance energy harvesting and coil detuning circuits shown in FIGS. 1-4 and 6-10, for example.

The computer system 1100 can include a set of instructions that can be executed to cause the computer system 1100 to perform any one or more of the methods or computer based functions disclosed herein. The computer system 1100 may operate as a standalone device or may be connected, for example, using a network 1101, to other computer systems or peripheral devices. The computer system 1100 may be connected, for example, via the coaxial output in FIG. 10, or via a control housing 420 in FIG. 4.

In a networked deployment, the computer system 1100 may operate in the capacity of a server or as a client user computer in a server-client user network environment, or as a peer computer system in a peer-to-peer (or distributed) network environment. The computer system 1100 can also be implemented as or incorporated into various devices, such as a stationary computer, a mobile computer, a personal computer (PC), a laptop computer, a tablet computer, or any other machine capable of executing a set of instructions (sequential or otherwise) that specify actions to be taken by that machine. The computer system 1100 can be incorporated as or in a particular device that in turn is in an integrated system that includes additional devices. In a particular embodiment, the computer system 1100 can be implemented using electronic devices that provide audio, video or data communication. Further, while a single computer system 1100 is illustrated, the term "system" shall also be taken to include any collection of systems or sub-systems that individually or jointly execute a set, or multiple sets, of instructions to perform one or more computer functions.

As illustrated in FIG. 11, the computer system 1100 includes a processor 1110. The processor 1110 for the computer system 1100 may include a dedicated memory, such as random access memory (RAM) and/or read only memory (ROM), which are tangible and non-transitory. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A processor is an article of manufacture and/or a machine component. A processor for a computer system 1100 is configured to execute software instructions in order to perform functions as described in the various embodiments herein. A processor for a computer system 1100 may be a general purpose processor or may be part of an application specific integrated circuit (ASIC). A processor for a computer system 1100 may also be a microprocessor, a microcomputer, a processor chip, a controller, a microcontroller, a digital signal processor (DSP), a state machine, or a programmable logic device. A processor for a computer system 1100 may also be a logical circuit, including a programmable gate array (PGA) such as a field programmable gate array (FPGA), or another type of circuit that includes discrete gate and/or transistor logic. A processor for a computer system 1100 may be a central processing unit (CPU), a graphics processing unit (GPU), or both. Additionally, any processor described herein may include multiple processors, parallel processors, or both. Multiple processors may be included in, or coupled to, a single device or multiple devices.

Moreover, the computer system 1100 includes a main memory 1120 and a static memory 1130 that can communicate with each other via a bus 1108. Memories described herein are tangible storage mediums that can store data and executable instructions, and are non-transitory during the time instructions are stored therein. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A memory described herein is an article of manufacture and/or machine component. Memories described herein are computer-readable mediums from which data and executable instructions can be read by a computer. Memories as described herein may be random access memory (RAM), read only memory (ROM), flash memory, electrically programmable read only memory (EPROM), electrically erasable programmable read-only memory (EEPROM), registers, a hard disk, or any other form of storage medium known in the art. Memories may be volatile or non-volatile, secure and/or encrypted, unsecure and/or unencrypted.

As shown, the computer system 1100 may further include a video display unit 1150, such as a liquid crystal display (LCD), an organic light emitting diode (OLED), a flat panel display, a solid state display, or a cathode ray tube (CRT). Additionally, the computer system 1100 may include an input device 1160, such as a keyboard/virtual keyboard or touch-sensitive input screen or speech input with speech recognition, and a cursor control device 1170, such as a mouse or touch-sensitive input screen or pad. The computer system 1100 can also include a signal generation device 1190, such as a speaker or remote control, and a network interface device 1140.

In an alternative embodiment, dedicated hardware implementations, such as application-specific integrated circuits (ASICs), programmable logic arrays and other hardware components, can be constructed to implement one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor and/or memory.

In accordance with various embodiments of the present disclosure, the methods described herein may be implemented using a hardware computer system that executes software programs. Further, in an exemplary, non-limited embodiment, implementations can include distributed processing, component/object distributed processing, and parallel processing. Virtual computer system processing can be constructed to implement one or more of the methods or functionality as described herein, and a processor described herein may be used to support a virtual processing environment.

Figure 12:
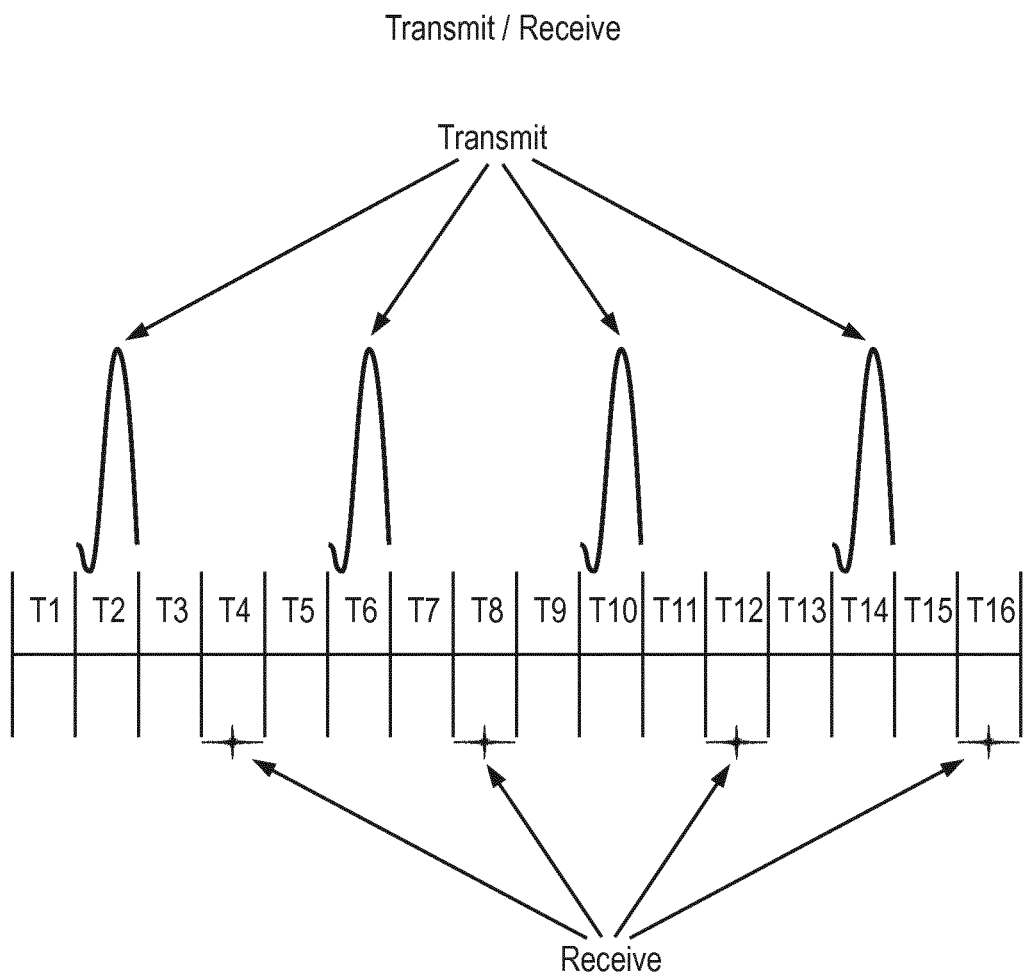
FIG. 12 is a sequence chart for wireless magnetic resonance energy harvesting and coil detuning, in accordance with a representative embodiment of the present disclosure.

FIG. 12 is a sequence chart for wireless magnetic resonance energy harvesting and coil detuning, in accordance with a representative embodiment of the present disclosure. In FIG. 12, a transmit/receive cycle is shown. The transmit/receive cycle in FIG. 12 may be controlled by a computer system 1100 as shown in FIG. 11. In FIG. 12, transmit periods T2, T6, T10, T14 correspond to transmissions of approximately 20 microTeslas maximum from the radio frequency coil(s) 107 or 307 in a transmit stage. Receive periods T4, T8, T12, T16 correspond to reception of approximately ~10 picoTeslas maximum from the hydrogen nuclei of the water molecules in a receive stage.

In FIG. 12, post-receive periods T1, T5, T9, T13 are approximately 100 microseconds minimum. Post-transmit periods T3, T7, T11, T15 are approximately 10 microseconds minimum. As should be clear, the post-transmit periods are significantly shorter than the post-receive periods. This may be due to the need to quickly begin receive operations after a transmission, as the radio frequency signals from stimulated hydrogen nuclei of water molecules in a subject being imaged are relatively weak from the beginning.

Accordingly, wireless magnetic resonance energy harvesting and coil detuning enables detuning of a coil such as a radio frequency surface coil 320 without using direct current cables connected to a main power supply of a magnetic resonance imaging system 100, 300. Wireless magnetic resonance energy harvesting and coil detuning enables reusing energy from coil transmissions in the transmit stages. Although not described exhaustively herein, the harvesting of energy is not enough to substantively interfere with the transmissions of energy from the radio frequency coil(s) 107, 307. The harvesting of energy may for example, involve capturing less than 5% or even less than 1% of the energy emitted by a radio frequency coil(s) 107, 307 in transmit stages.

Although wireless magnetic resonance energy harvesting and coil detuning has been described with reference to several exemplary embodiments, it is understood that the words that have been used are words of description and illustration, rather than words of limitation. Changes may be made within the purview of the appended claims, as presently stated and as amended, without departing from the scope and spirit of wireless magnetic resonance energy harvesting and coil detuning in its aspects. Although wireless magnetic resonance energy harvesting and coil detuning has been described with reference to particular means, materials and embodiments, wireless magnetic resonance energy harvesting and coil detuning is not intended to be limited to the particulars disclosed; rather wireless magnetic resonance energy harvesting and coil detuning extends to all functionally equivalent structures, methods, and uses such as are within the scope of the appended claims.

For example, the present disclosure mainly describes placing power detect circuits within an imaging zone 108, 308 along with other circuits of a wireless magnetic resonance energy harvesting and coil detuning system. However, power detect circuits 261-280 or power sensors 370 can be placed outside of the imaging zone, such as towards the top of the bore and close to the radio frequency coil(s) 107, 307, without departing from the scope of the present teachings. Moreover, power detect circuits 261-280 may be integrated with radio frequency coil(s) 107, 307, so that the power detection itself does not have to be performed wirelessly even when the energy harvesting is performed wirelessly.

Additionally, the present disclosure mainly describes safety checks being performed before energy harvesting or detuning is performed. However, safety checks may be performed even while energy is harvested and/or while detuning is performed. For example, a safety check may include monitoring harvested energy in real time or near-real time to determine when too much energy is being harvested such that the magnetic resonance imaging system should be shut down.

Moreover, the present disclosure mainly described energy storage in terms of batteries. However, other forms of energy storage can be used, even on a short-term basis. Harvested energy can be stored, for example, using a superconductor or other form of energy storage without deviating from the teachings of the present application.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention, inventive concept or embodiment thereof. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

According to an aspect of the present disclosure, a magnetic resonance system includes a wireless power detection sensor and a wireless energy harvesting circuit. The wireless power detection sensor detects magnetic resonance transmissions. The wireless energy harvesting circuit harvests energy from the magnetic resonance transmissions based on the wireless power detection sensor detecting the magnetic resonance transmissions.

According to another aspect of the present disclosure, the wireless power detection sensor detects when magnetic resonance transmissions exceed a threshold. The wireless power detection sensor generates and sends a signal to the wireless energy harvesting circuit based on detecting that the magnetic resonance transmissions reach a threshold.

According to yet another aspect of the present disclosure, a threshold is correlated with an operational pulse from the magnetic resonance system. The wireless energy harvesting circuit harvests energy from the magnetic resonance transmissions when the magnetic resonance system generates the operational pulse in a transmission stage.

According to still another aspect of the present disclosure, a threshold is correlated with an operational pulse of the magnetic resonance system. The wireless energy harvesting circuit does not harvest energy from the magnetic resonance transmission when the magnetic resonance system does not generate the operational pulse in a reception stage.

According to another aspect of the present disclosure, the magnetic resonance system also includes a magnetic coil element and a detuning circuit. The magnetic coil element is used to generate the magnetic resonance power for the magnetic resonance transmissions. The detuning circuit detunes at least one radio frequency coil element of the magnetic resonance system using the harvested energy from the wireless energy harvesting circuit.

According to yet another aspect of the present disclosure, the magnetic resonance system also includes a storage that stores energy from the harvested energy.

According to yet another aspect of the present disclosure, the magnetic resonance system stores energy in the storage from the harvested energy when the magnetic resonance system generates an operational pulse detected by the wireless power detection sensor.

According to still another aspect of the present disclosure, the detuning circuit and the wireless energy harvesting circuit are both turned off when the magnetic resonance system does not generate an operational pulse.

According to another aspect of the present disclosure, the magnetic resonance system includes a magnetic resonance imaging system used to produce images of a subject within the magnetic coil element.

According to yet another aspect of the present disclosure, energy from the harvested energy is used by the detuning circuit to detune the magnetic coil element in a single continuous period while the magnetic resonance power is generated.

According to still another aspect of the present disclosure, the magnetic resonance system detects a rate at which the wireless energy harvesting circuit harvests energy and compares the detected rate with a predetermined threshold. The magnetic resonance system stops magnetic resonance transmissions when the detected rate exceeds the predetermined threshold.

According to another aspect of the present disclosure, the detune circuit includes a switch. The magnetic resonance system detects when the switch in the detune circuit indicates one of a short circuit and an open circuit. The magnetic resonance system stops magnetic resonance transmissions based on detecting a short circuit or an open circuit.

According to an aspect of the present disclosure, an operational method for a magnetic resonance system includes detecting, by a wireless power detection sensor, magnetic resonance transmissions. A wireless energy harvesting circuit harvests energy from the magnetic resonance transmissions based on the wireless power detection sensor detecting the magnetic resonance transmissions.

According to another aspect of the present disclosure, the method includes determining, during the magnetic resonance transmissions, whether to detune a magnetic coil element used to generate magnetic resonance power for the magnetic resonance transmissions. The method also includes selectively detuning the magnetic coil element based on the determining and using the harvested energy from the wireless energy harvesting circuit.

According to yet another aspect of the present disclosure, the method also includes confirming that the magnetic resonance transmissions have stopped. The selective detuning is performed only after confirming that the magnetic resonance transmissions have stopped.

According to still another aspect of the present disclosure, the method also includes performing a predetermined safety check on the magnetic resonance system. The harvesting is performed based on passing the predetermined safety check.

As described herein, energy is harvested wireless during a transmit pulse of a magnetic resonance sequence. The energy is used to supply power to other circuits, including, for example, a detune circuit that detunes a radio frequency coil and/or a power detection sensor that detects the transmit pulse. An energy harvesting circuit provides operating voltages to the power detection sensor and the detune circuit. The energy harvesting circuit and power detection sensor may be individually provided for each channel on field gradient coils of a magnetic resonance imaging system. As a result, power harvesting can be automated, and integrated with power and control management of circuits and sensors in magnetic resonance imaging systems.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. A magnetic resonance imaging system, comprising:
   a wireless power detection sensor configured to detect power levels of magnetic resonance transmissions from one or more coils of the magnetic resonance imaging system; and
   a wireless energy harvesting circuit separate from the wireless power detection sensor and configured to harvest energy from the detected magnetic resonance transmissions.

2. The magnetic resonance imaging system of claim 1,
   wherein the wireless power detection sensor is configured to detect when the power levels of the magnetic resonance transmissions exceed a threshold power, and
   wherein the wireless power detection sensor is configured to generate and send a signal to the wireless energy harvesting circuit based on detecting that the magnetic resonance transmissions reach the threshold.

3. The magnetic resonance imaging system of claim 2,
   wherein the threshold power is correlated with the power levels of the magnetic resonance imaging transmissions, and
   wherein the wireless energy harvesting circuit harvests energy from the magnetic resonance transmissions when the wireless power detection sensor detects that the one or more coils transmit the magnetic resonance transmissions.

4. The magnetic resonance imaging system of claim 2,
   wherein the threshold is correlated with the power levels of the magnetic resonance imaging transmissions, and
   wherein the wireless energy harvesting circuit does not harvest energy from the magnetic resonance transmission when the wireless power detection sensor detects that the one or more coils receive magnetic resonance transmissions.

5. The magnetic resonance imaging system of claim 1, further comprising:
   a magnetic coil element configured to generate the magnetic resonance power for the magnetic resonance transmissions; and
   a detuning circuit configured to detune the magnetic coil element using the harvested energy.

6. The magnetic resonance imaging system of claim 5, further comprising:
   a storage that stores the harvested energy.

7. The magnetic resonance imaging system of claim 6,
   wherein the magnetic resonance system stores the harvested energy in the storage when the wireless power detection sensor detects the magnetic resonance transmissions.

8. The magnetic resonance imaging system of claim 7,
   wherein the detuning circuit and the wireless energy harvesting circuit are both turned off when the wireless power detection sensor does not detect the magnetic resonance transmissions.

9. The magnetic resonance imaging system of claim 5,
   wherein energy from the harvested energy is used by the detuning circuit to detune the magnetic coil element in a single continuous period while the magnetic resonance power is generated.

10. The magnetic resonance imaging system of claim 1,
wherein the magnetic resonance system is configured to detect a rate at which the wireless energy harvesting circuit harvests energy and compare the detected rate with a predetermined threshold, and
wherein the magnetic resonance system is configured to stop magnetic resonance transmissions when the detected rate exceeds the predetermined threshold.

11. The magnetic resonance imaging system of claim 5,
wherein the detuning circuit comprises a switch,
wherein the magnetic resonance system detects when the switch in the detuning circuit indicates one of a short circuit and an open circuit, and
wherein the magnetic resonance system is configured to stop magnetic resonance transmissions based on detecting a short circuit or an open circuit.

12. An operational method for a magnetic resonance imaging system, comprising:
detecting, by a wireless power detection sensor, magnetic resonance transmissions from one or more coils of the magnetic resonance imaging system; and
harvesting, by a wireless energy harvesting circuit separate from the wireless power detection sensor, energy from the detected magnetic resonance transmissions.

13. The operational method of claim 12, further comprising:
determining, during the magnetic resonance transmissions, whether to detune a magnetic coil element used to generate magnetic resonance power for the magnetic resonance transmissions; and
selectively detuning the magnetic coil element based on the determining and using the harvested energy from the wireless energy harvesting circuit.

14. The operational method of claim 13, further comprising:
confirming that the magnetic resonance transmissions have stopped,
wherein the selective detuning is performed only after confirming that the magnetic resonance transmissions have stopped.

15. The operational method of claim 12, further comprising:
performing a predetermined safety check on the magnetic resonance system,
wherein, the harvesting is performed based on passing the predetermined safety check.

16. A magnetic resonance imaging system, comprising:
one or more magnetic coil elements configured to generate magnetic resonance power for magnetic resonance transmissions;
a wireless power detection sensor configured to detect power levels of the generated magnetic resonance power; and
a wireless energy harvesting circuit separate from the wireless power detection sensor and configured to harvest energy from the detected power levels.

17. The magnetic resonance imaging system of claim 16, further comprising:
a detuning circuit configured to detune the one or more magnetic coil elements using the harvested energy.

18. The magnetic resonance imaging system of claim 16, further comprising:
a storage that stores the harvested energy.

19. The magnetic resonance imaging system of claim 16, wherein the wireless power detection sensor is configured to:
detect when the power levels of the magnetic resonance transmissions exceed a threshold power, and
generate and send a signal to the wireless energy harvesting circuit based on detecting that the magnetic resonance transmissions reach the threshold.

20. The magnetic resonance imaging system of claim 19, wherein the threshold power is correlated with the power levels of the magnetic resonance imaging transmissions, and wherein the wireless energy harvesting circuit is configured to:
harvest energy from the magnetic resonance transmissions when the wireless power detection sensor detects that the one or more coils transmit the magnetic resonance transmissions; and
not harvest energy from the magnetic resonance transmission when the wireless power detection sensor detects that the one or more coils receive magnetic resonance transmissions.

* * * * *